(12) United States Patent
U'Ren et al.

(10) Patent No.: US 6,759,674 B2
(45) Date of Patent: Jul. 6, 2004

(54) BAND GAP COMPENSATED HBT

(75) Inventors: Greg D. U'Ren, Corona del Mar, CA (US); Klaus F. Schuegraf, Aliso Viejo, CA (US); Marco Racanelli, Santa Ana, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 10/066,871

(22) Filed: Feb. 4, 2002

(65) Prior Publication Data

US 2003/0146448 A1 Aug. 7, 2003

(51) Int. Cl.[7] ............... H01L 29/06; H01L 31/072; H01L 31/11
(52) U.S. Cl. ............. 257/12; 257/593; 257/197; 257/616
(58) Field of Search ............. 257/12, 593, 197, 257/616, 200

(56) References Cited

U.S. PATENT DOCUMENTS 6,316,795 B1 * 11/2001 Croke, III .................. 257/197
6,492,711 B1 * 12/2002 Takagi et al. ............... 257/593
6,667,489 B2 * 12/2003 Suzumura et al. ........... 257/12
2002/0160587 A1   10/2002 Jagannathan et al.
2002/0163013 A1   11/2002 Toyoda et al.
2002/0182423 A1 * 12/2002 Chu et al. .................. 428/446

FOREIGN PATENT DOCUMENTS

EP           1 065 728 A2   6/2000

* cited by examiner

*Primary Examiner*—Tom Thomas
*Assistant Examiner*—Joseph Nguyen
(74) *Attorney, Agent, or Firm*—Farjami & Farjami LLP

(57) ABSTRACT

According to one exemplary embodiment, a heterojunction bipolar transistor comprises a base having a concentration of a first material at a first depth, where the first material impedes the diffusion of a base dopant. The first material also causes a change in band gap at the first depth in the base. According to this exemplary embodiment, the base further includes a concentration of a second material, where the concentration of second material increases at the first depth so as to counteract the change in band gap.

19 Claims, 5 Drawing Sheets

BAND GAP COMPENSATED HBT

BACKGROUND OF THE INVENTION

1. Field of the Invention

The present invention is generally in the field of fabrication of semiconductor devices. More particularly, the present invention is in the field of fabrication of heterojunction bipolar transistors.

2. Related Art

In a silicon-germanium ("SiGe") heterojunction bipolar transistor ("HBT"), a thin silicon-germanium layer is grown as the base of a bipolar transistor on a silicon wafer.

The SiGe HBT has significant advantages in speed, frequency response, and gain when compared to a conventional silicon bipolar transistor. Cutoff frequencies in excess of 100 GHz, which are comparable to the more expensive gallium-arsenide based devices, have been achieved for the SiGe HBT.

The higher gain, speed and frequency response of the SiGe HBT are possible due to certain advantages of silicon-germanium, such as a narrower band gap and reduced resistivity. These advantages make silicon-germanium devices more competitive than silicon-only devices in areas of technology where high speed and high frequency response are required.

The advantages of high speed and high frequency response discussed above require the realization of a thin highly doped base layer in the NPN SiGe HBT. For example, boron is commonly utilized to provide P-type doping of the base in an NPN silicon-germanium HBT. However, boron has a tendency to diffuse in the base. In other words, the boron profile in the base has a tendency to widen, thus undesirably widening the base. Boron diffusion is further accelerated during subsequent thermal processing steps that occur in the fabrication of the NPN SiGe HBT. The increased boron diffusion can severely degrade the high frequency performance of the NPN SiGe HBT. Thus, suppression of boron diffusion presents a major challenge in the fabrication of a NPN SiGe HBT.

One method of suppressing boron diffusion in the base of the NPN SiGe HBT is by adding carbon in the base. To effectively arrest the diffusion of boron, a heavy carbon doping level is required. For example, a concentration greater than approximately 0.1 atomic percent of carbon can be added in the base of the NPN SiGe HBT at the point where the concentration of boron peaks. Due to the high carbon concentration, the impact on the lattice is such that the periodicity of the lattice is altered to compensate total strain. Since the in-plane strain is key to band-gap narrowing in SiGe, the addition of carbon doping counters this benefit from which increased NPN performance is derived. Thus, although adding carbon in the base effectively suppresses boron diffusion, the addition of carbon has the undesirable effect of increasing the band gap in the base and consequently diminishing the performance of the NPN SiGe HBT.

Graph 100 in FIG. 1 shows exemplary boron, carbon, and germanium profiles in a base in an NPN SiGe HBT. Graph 100 includes concentration level axis 102 plotted against depth axis 104. Concentration level axis 102 shows relative concentration levels of boron, carbon and germanium. Depth axis 104 shows increasing depth into the base, starting at the top surface of the base, i.e. at the transition from emitter to base in the NPN SiGe HBT. The top surface of the base in the NPN SiGe HBT corresponds to "0" on depth axis 104.

Graph 100 also includes boron profile 106, which shows the concentration of boron in the base, plotted against depth, i.e. distance into the base. Boron profile 106 includes peak boron concentration level 108, which occurs at depth 114. Graph 100 further includes carbon profile 112, which shows the concentration of carbon in the base, plotted against depth. The concentration of carbon in carbon profile 112 increases abruptly from 0.0 to a constant level at depth 114, and remains at a constant level from depth 114 to depth 122. At depth 122, the carbon concentration level decreases abruptly to 0.0.

Graph 100 further includes germanium profile 116, which shows the concentration of germanium in the base of the present exemplary NPN SiGe HBT, plotted against depth. Germanium profile 116 begins at 0.0 concentration level at depth 110 and ramps up, i.e. increases linearly, to depth 118. Germanium profile 116 maintains a constant concentration level from depth 118 to depth 120. At depth 120, germanium profile 116 ramps down, i.e. decreases linearly, to 0.0 concentration level at depth 122. Thus, a concentration of carbon is added in the base of the NPN SiGe HBT at depth 114, which corresponds to peak boron concentration level 108.

Graph 200 in FIG. 2 shows an exemplary band gap curve in the base in the present exemplary NPN SiGe HBT. Graph 200 shows band gap curve 202, which shows the change in band gap caused by carbon profile 112 and germanium profile 116 in FIG. 1 in the base in the present exemplary NPN SiGe HBT. Graph 200 includes change in band gap axis 208 plotted against depth axis 204. It is noted that "0" on change in band gap axis 208 refers to the band gap of a reference base comprising only silicon, i.e. a silicon-only base. It is also noted that an upward move on band gap curve 202 indicates a decrease in the band gap of the base of the present exemplary NPN SiGe HBT relative to the band gap of a silicon-only base. Conversely, a downward move on band gap curve 202 indicates an increase in the band gap of the base relative to the band gap of a silicon-only base.

Depth axis 204 corresponds to depth axis 104 in FIG. 1. In particular, depths 210, 214, and 222, respectively, correspond to depths 110, 114, and 122 in FIG. 1. At depth 210, band gap curve 202 begins to decrease at a linear rate. As is known in the art, an increase in the concentration of germanium in a base of an NPN SiGe HBT results in a decrease in band gap. Thus, band gap curve 202 decreases from depth 210 to just prior to depth 214 as the result of a ramp up in concentration of germanium. At depth 214, the band gap increases abruptly from band gap level 212 to band gap level 216. This step increase in band gap corresponds to the addition of carbon in the base at depth 114 in FIG. 1. As such, the addition of carbon in the base of an NPN SiGe HBT results in an undesirable increase in the band gap of the base. This increase in band gap creates an electric field in the NPN SiGe HBT that opposes current flow, and thus results in a decrease in the speed that the NPN SiGe HBT can achieve.

Thus, there is a need in the art to provide a narrow base in a SiGe HBT by suppressing dopant diffusion in the base without causing a concomitant undesirable increase in band gap in the base.

SUMMARY OF THE INVENTION

The present invention is directed to a band gap compensated HBT. The present invention overcomes the need in the art for a narrow base in a SiGe HBT by suppressing dopant diffusion in the base without causing a concomitant undesirable increase in band gap in the base.

According to one exemplary embodiment, a heterojunction bipolar transistor comprises a base having a concentration of a first material at a first depth, where the concentration of the first material impedes the diffusion of a base dopant. For example, the first material can be carbon and the base dopant can be boron. The first material also causes a change in band gap at the first depth in the base. For example, the first material may cause an increase in band gap at the first depth in the base.

According to this exemplary embodiment, the base of the heterojunction bipolar transistor further comprises a concentration of a second material, where the concentration of the second material increases at the first depth so as to counteract the change in the band gap. For example, the second material may be germanium. The concentration of the second material, for example, may increase at the first depth by an amount required to cause a decrease in the band gap to be substantially equal to the increase in band gap caused by the concentration of the first material.

DETAILED DESCRIPTION OF THE INVENTION

The present invention is directed to a band gap compensated HBT. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

Figure 3:
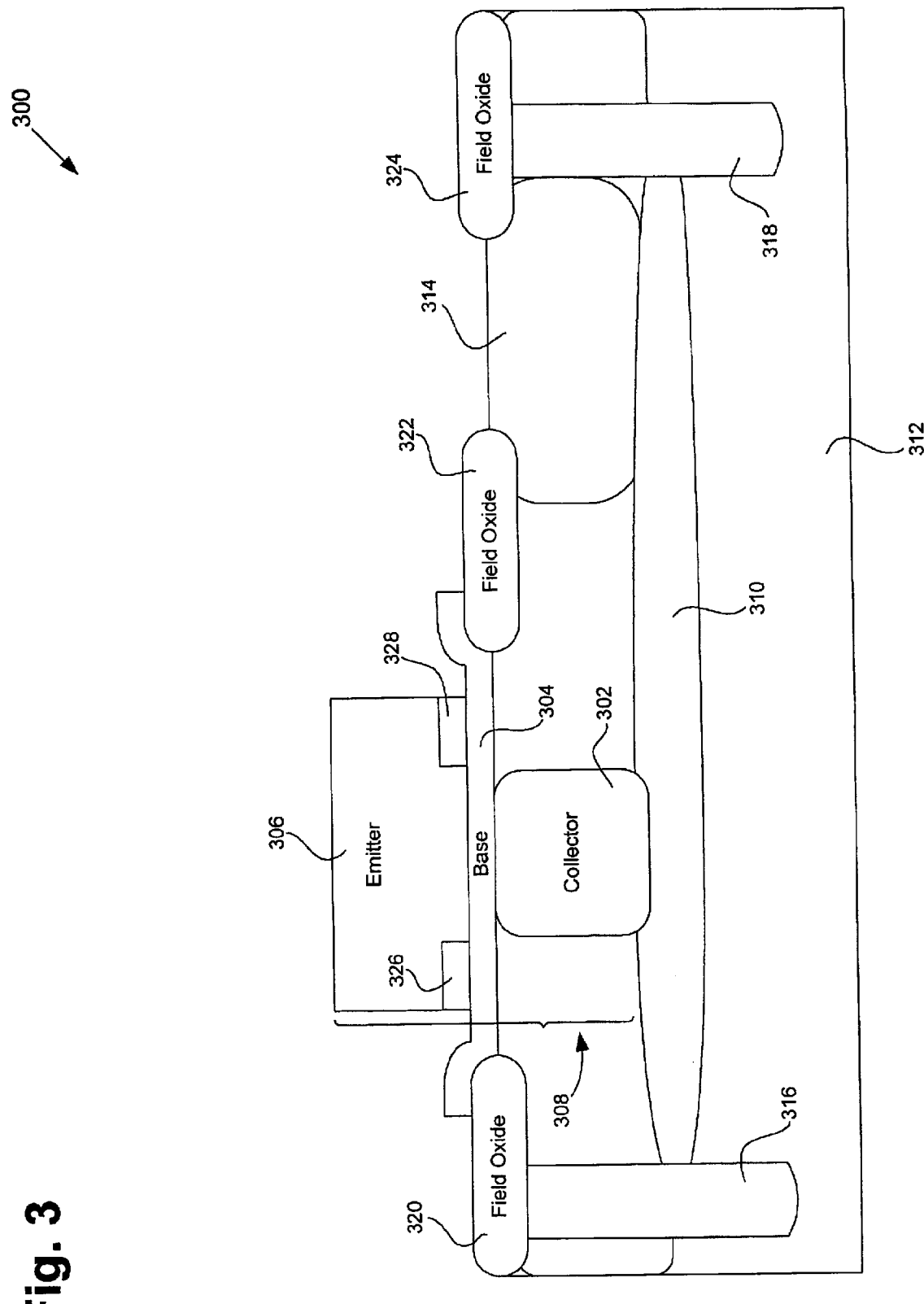
FIG. 3 illustrates an exemplary structure, including an exemplary NPN SiGe HBT, in accordance with one embodiment of the present invention.

FIG. 3 shows a cross-sectional view of structure 300, which is utilized to describe one embodiment of the present invention. Certain details and features have been left out of FIG. 3 that are apparent to a person of ordinary skill in the art. Although structure 300 illustrates an exemplary NPN SiGe HBT, the present invention manifestly applies to other similar or related structures, such as PNP HBTs. Structure 300 includes collector 302, base 304, and emitter 306. Collector 302 is N-type single crystal silicon, which might be deposited epitaxially using a reduced pressure chemical vapor deposition ("RPCVD") process in a manner known in the art. Base 304 is a P-type silicon-germanium single crystal that might be deposited epitaxially in an RPCVD process. As seen in FIG. 3, base 304 is situated on top of, and forms a junction with, collector 302. In the present exemplary embodiment, emitter 306, which is situated above and forms a junction with base 304, comprises N-type silicon. Collector 302, base 304, and emitter 306 thus form the present exemplary NPN SiGe HBT, which is generally referred to by numeral 308 in FIG. 3.

As seen in FIG. 3, buried layer 310, which comprises N+ type material, i.e. heavily doped N-type material, is formed in silicon substrate 312 in a manner known in the art. Collector sinker 314, which also comprises N+ type material, is formed by diffusion of heavily concentrated dopants from the surface of collector sinker 314 down to buried layer 310. Buried layer 310, along with collector sinker 314, provide a low resistance electrical pathway from collector 302 through buried layer 310 and collector sinker 314 to a collector contact (not shown in FIG. 3).

As further seen in FIG. 3, deep trench structures 316 and 318 and field oxide structures 320, 322, and 324 provide electrical isolation from other devices on silicon substrate 312. Deep trench structures 316 and 318 and field oxide structures 320, 322, and 324 might comprise, among other things, silicon oxide material and are formed in a manner known in the art. Dielectric segments 326 and 328, which can comprise silicon oxide, provide electrical isolation between emitter 306 and base 304.

By way of background, characteristics and functionality of the present exemplary NPN SiGe HBT 308 are affected and can be tailored by varying steps of the fabrication process. One useful tool for controlling the resultant performance characteristics of NPN SiGe HBT 308 is the dopant and silicon-germanium profiles. In particular, it is desirable to accurately control the dopant and silicon-germanium profiles of base 304 to achieve a desired NPN SiGe HBT performance. In the present application, a dopant profile in base 304 is also referred to as a concentration of the base dopant, such as boron, in base 304.

Figure 4:
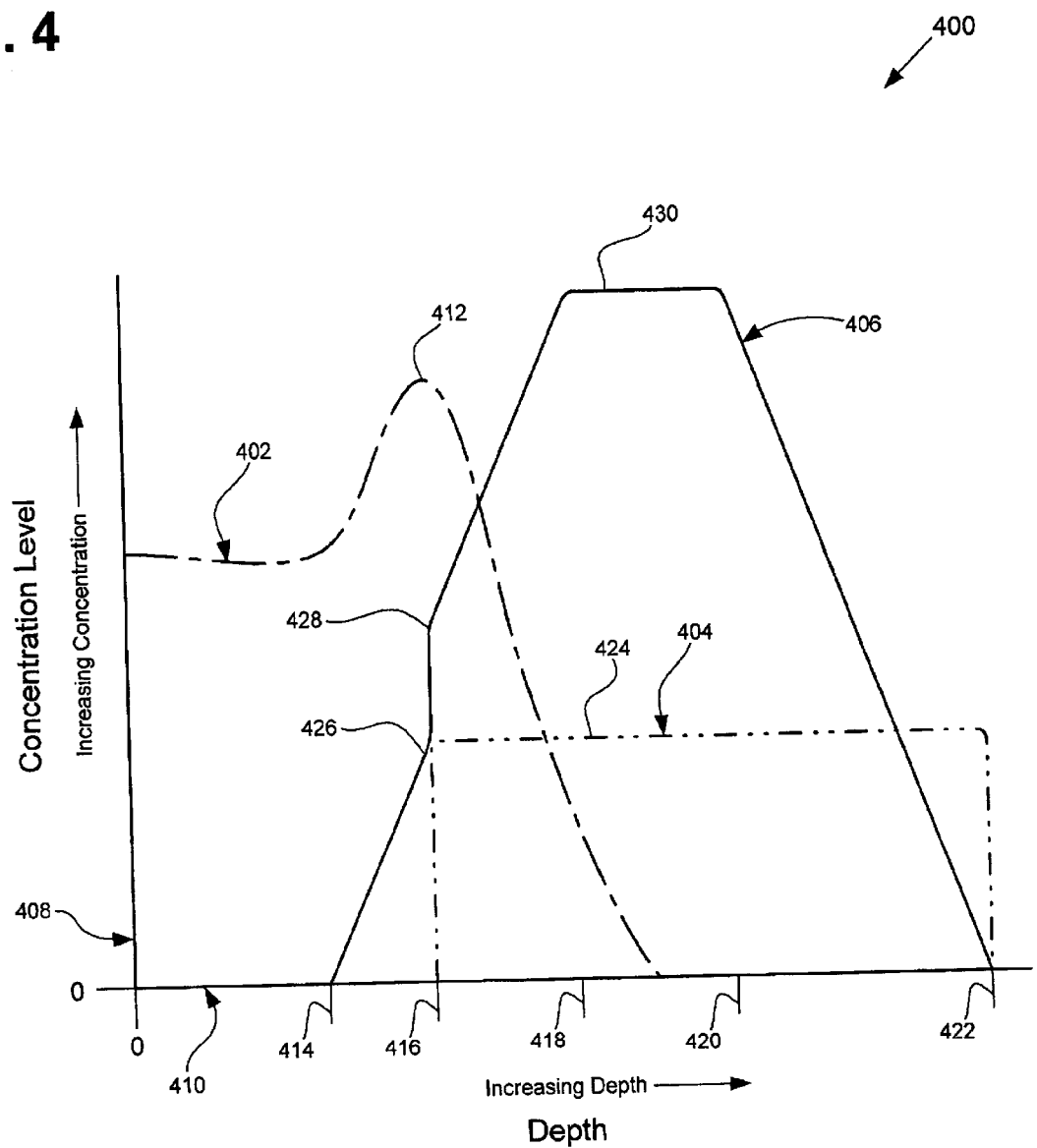
FIG. 4 is a graph showing boron, carbon, and germanium profiles in the base of an exemplary NPN SiGe HBT in accordance with one embodiment of the present invention.

Graph 400 in FIG. 4 shows exemplary boron, carbon, and germanium profiles in the base of an exemplary NPN SiGe HBT in accordance with one embodiment of the present invention. In particular, boron profile 402, carbon profile 404, and germanium profile 406, respectively, in graph 400 show boron, carbon, and germanium profiles in base 304 in FIG. 3. Graph 400 includes concentration level axis 408 plotted against depth axis 410. Concentration level axis 408 shows relative concentration levels of boron, carbon, and germanium, respectively, in boron profile 402, carbon profile 404, and germanium profile 406.

Depth axis 410 shows increasing depth into base 304 in FIG. 3, starting at the top surface of base 304. Thus, "0" on depth axis 410 indicates the approximate transition from emitter 306 to base 304. Additionally, depth 422 on depth axis 410 indicates the approximate transition from base 304 to collector 302 of NPN SiGe HBT 308 in FIG. 3. Boron profile 402 shows the concentration of boron in base 304, plotted against depth, i.e. distance into base 304. Boron profile 402 includes boron peak 412, which represents the peak concentration level of boron in base 304. Boron peak 412 occurs at depth 416 in base 304. It is noted that boron is used as an exemplary P-type dopant in the present exemplary NPN HBT for the purpose of illustrating the present invention by way of a specific example. However, the principles of the present invention apply equally to an NPN HBT using a different P-type dopant in its base and even to a PNP HBT using an N-type dopant in its base.

Continuing with graph 400, carbon profile 404 shows the concentration of carbon in base 304, plotted against depth, i.e. distance into base 304. It is noted that carbon is also referred to as a "diffusion suppressant" or as "impeding" diffusion in the present application. As shown in FIG. 4, carbon profile 404 begins at depth 416, where a concentration of carbon is introduced into base 304. In other words, carbon doping begins at depth 416 in base 304. At depth 416, the concentration of carbon increases abruptly from 0.0 concentration level to carbon concentration level 424. For example, carbon concentration level 424 can be approximately 0.5 atomic percent of carbon. The concentration of carbon remains at carbon concentration level 424 down to depth 422. At depth 422, the carbon concentration level in base 304 abruptly decreases from carbon concentration level 424 to 0.0 carbon concentration.

Carbon is introduced into a base of the present exemplary NPN SiGe HBT to suppress boron diffusion, which can desirably decrease the effective base width. For example, the thermal annealing process utilized in the fabrication of the NPN SiGe HBT can cause boron to diffuse into adjoining silicon regions of the NPN SiGe HBT, which can severely degrade the performance of the NPN SiGe HBT. Although carbon effectively suppresses boron diffusion, the addition of carbon into the base results in an undesirable increase in band gap in the base. For example, an introduction of 1.0 atomic percent of carbon in the base increases the band gap by approximately +10.0 milli-electron volts (meV).

Continuing with graph 400 in FIG. 4, germanium profile 406 shows the concentration of germanium in base 304, plotted against depth, i.e. distance into base 304. Germanium profile 406 begins at depth 414 in base 304, and it (i.e. germanium profile 406) ends at depth 422, which corresponds to the approximate start of collector 302 in FIG. 3. The germanium concentration level in silicon-germanium base 304 starts at 0.0 germanium concentration at depth 414 and ramps up, i.e. increases linearly, to germanium concentration level 426 just prior to reaching depth 416.

By way of background, increasing the concentration of germanium in a base of an NPN SiGe HBT results in a reduction in band gap in the base. For example, 8.0 atomic percent of germanium is equivalent to a reduction in band gap of approximately 10.0 meV. The reduction in band gap allows an electric field to build up in the base, which produces the desirable result of increasing performance of the NPN SiGe HBT. In addition, increasing the concentration of germanium in a base of an NPN SiGe HBT correspondingly increases the in-plane stress and changes the electronic band structure favorably to enhance carrier mobility, thereby increasing performance of the NPN SiGe HBT.

According to an embodiment of the present invention, at depth 416, which coincides with the addition of carbon in base 304, the concentration of germanium is stepped up, i.e. abruptly increased, to germanium concentration level 428. As a result of the step increase in the concentration of germanium at depth 416, the band gap is correspondingly decreased in base 304. However, as discussed above, the introduction of carbon at depth 416 results in an increase of band gap corresponding to the amount of carbon added at depth 416. Thus, the increase in concentration of germanium at depth 416, in accordance to one embodiment, offsets the increase in band gap resulting from the addition of carbon at depth 416.

For example, an addition of 0.5 atomic percent of carbon at depth 416 results in an increase in band gap of approximately 5.0 meV, since, as discussed above, 1.0 atomic percent of carbon results in an increase in band gap of approximately 10.0 meV. However, as discussed above, 10.0 atomic percent of germanium is equivalent to a reduction in band gap of approximately 10.0 meV. Thus, the amount of increase in concentration of germanium necessary to offset 0.5 atomic percent of carbon would be approximately 5.0 atomic percent. Accordingly, to offset the addition of 0.5 atomic percent of carbon at depth 416, the concentration of germanium at depth 416 is stepped up, i.e. abruptly increased, by 5.0 atomic percent of germanium.

As shown in Graph 400, the concentration of germanium continues to ramp up, i.e. increase linearly, from depth 416 to depth 418. The ramp up of germanium concentration builds a desirable electric field in base 304. For example, the distance between depth 414 and depth 418 can be approximately 200.0 Angstroms. When, for example, germanium ramps up to a concentration level of 25.0 atomic percent at depth 418, which corresponds to a band gap change of approximately 25.0 meV over 200.0 angstrom (10.0 atomic percent of germanium is equivalent to a reduction in band gap of approximately 10.0 meV). The corresponding electric field gradient would be approximately 25.0 meV/200.0 angstroms or approximately $1.25*10^4$ volts per centimeter.

At depth 418, the concentration of germanium reaches germanium concentration level 430. The concentration level of germanium remains at germanium concentration level 430 from depth 418 to depth 420. For example, germanium concentration level 430 can be 25.0 atomic percent of germanium. Between depth 420 and depth 422, the germanium concentration level ramps down, i.e. decreases linearly, from germanium concentration level 430 at depth 420 to a germanium concentration level of 0.0 at depth 422.

Thus, by abruptly increasing the germanium concentration level at depth 416, the present invention compensates for the addition of carbon in base 304. As such, the present invention preserves the advantage of a narrow boron profile in base 304 by utilizing carbon to prevent the diffusion of boron from increasing the effective size, i.e. widening, base 304. Furthermore, the present invention provides the advantage of a continuous decrease in band gap from depth 414 to depth 418 by abruptly increasing the germanium concentration at depth 416 to compensate for the increase in band gap resulting from the introduction of carbon at depth 416.

Figure 5:
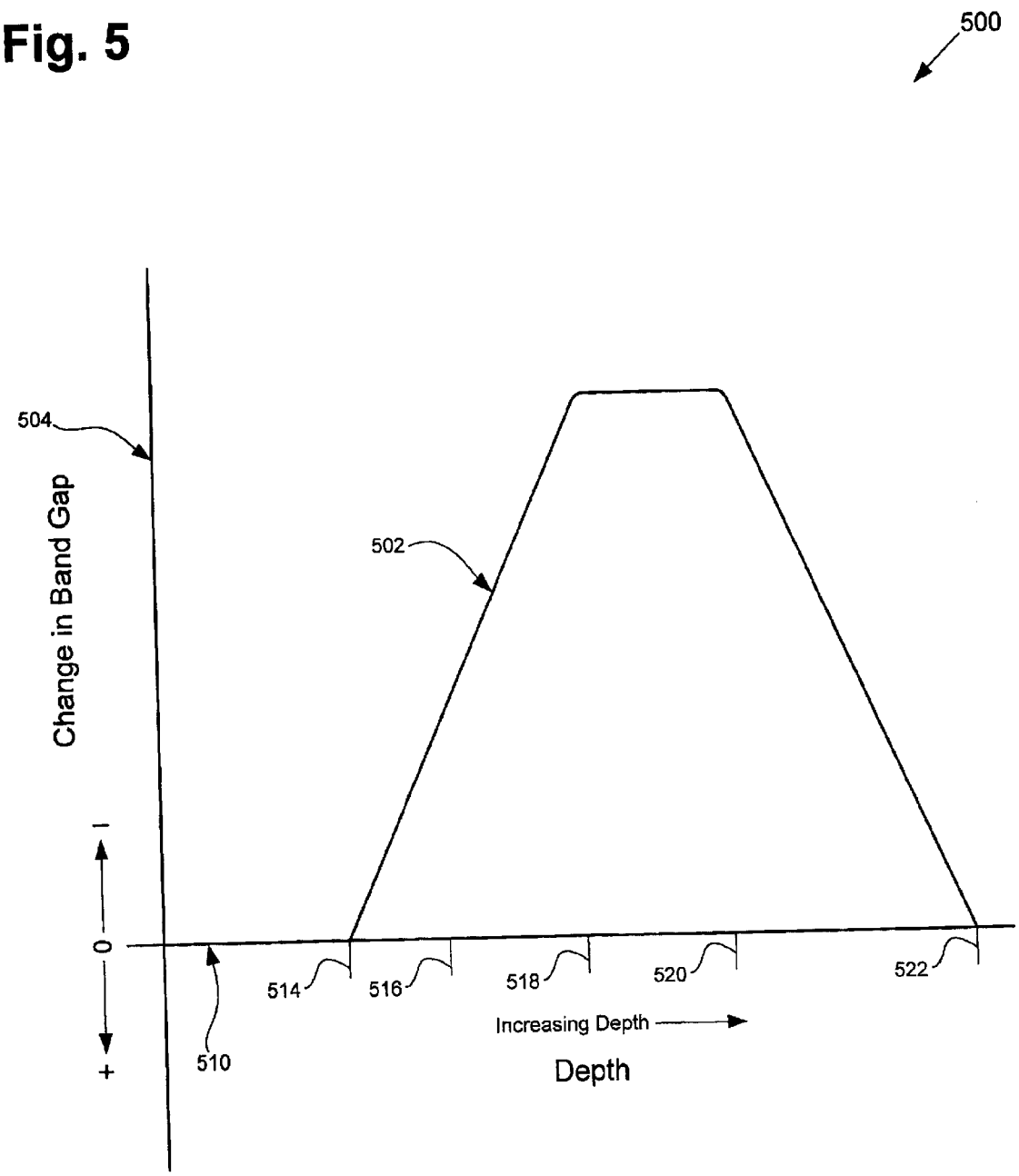
FIG. 5 is a graph showing a change in band gap of the base of the exemplary NPN SiGe HBT of FIG. 4 in accordance with one embodiment of the present invention.

Graph 500 in FIG. 5 shows an exemplary band gap curve in the base in the exemplary NPN SiGe HBT in accordance with one embodiment of the present invention. Graph 500 shows band gap curve 502, which shows the change in band gap caused by carbon profile 404 and germanium profile 406 in FIG. 4 in base 304 in FIG. 3. Graph 500 includes change in band gap axis 504 plotted against depth axis 510. It is noted that "0" on change in band gap axis 504 refers to the band gap of a reference base comprising only silicon, i.e. a "silicon-only" base. It is also noted that an upward move on band gap curve 502 indicates a decrease in the band gap of base 304 relative to the band gap of a silicon-only base. Conversely, a downward move on band gap curve 502 indicates an increase in the band gap of base 304 relative to the band gap of a silicon-only base.

Depth axis 510 corresponds to depth axis 410 in FIG. 4. In particular, depths 514, 516, 518, 520, and 522, respectively, on depth axis 510 correspond to depths 414, 416, 418, 420, and 422 on depth axis 410 in FIG. 4. As shown in graph 500, band gap curve 502 indicates a linear decrease in band gap of base 304 from depth 514 to depth 518. The linear decrease in band gap from depth 514 to depth 518 is caused by the increase in germanium concentration from depth 414 to depth 418 in FIG. 4. The increase germanium concentration from depth 414 to depth 418 includes a step increase of germanium at depth 416 provided by the present invention to offset the increase in band gap caused by the addition of carbon at depth 416.

Figure 1:
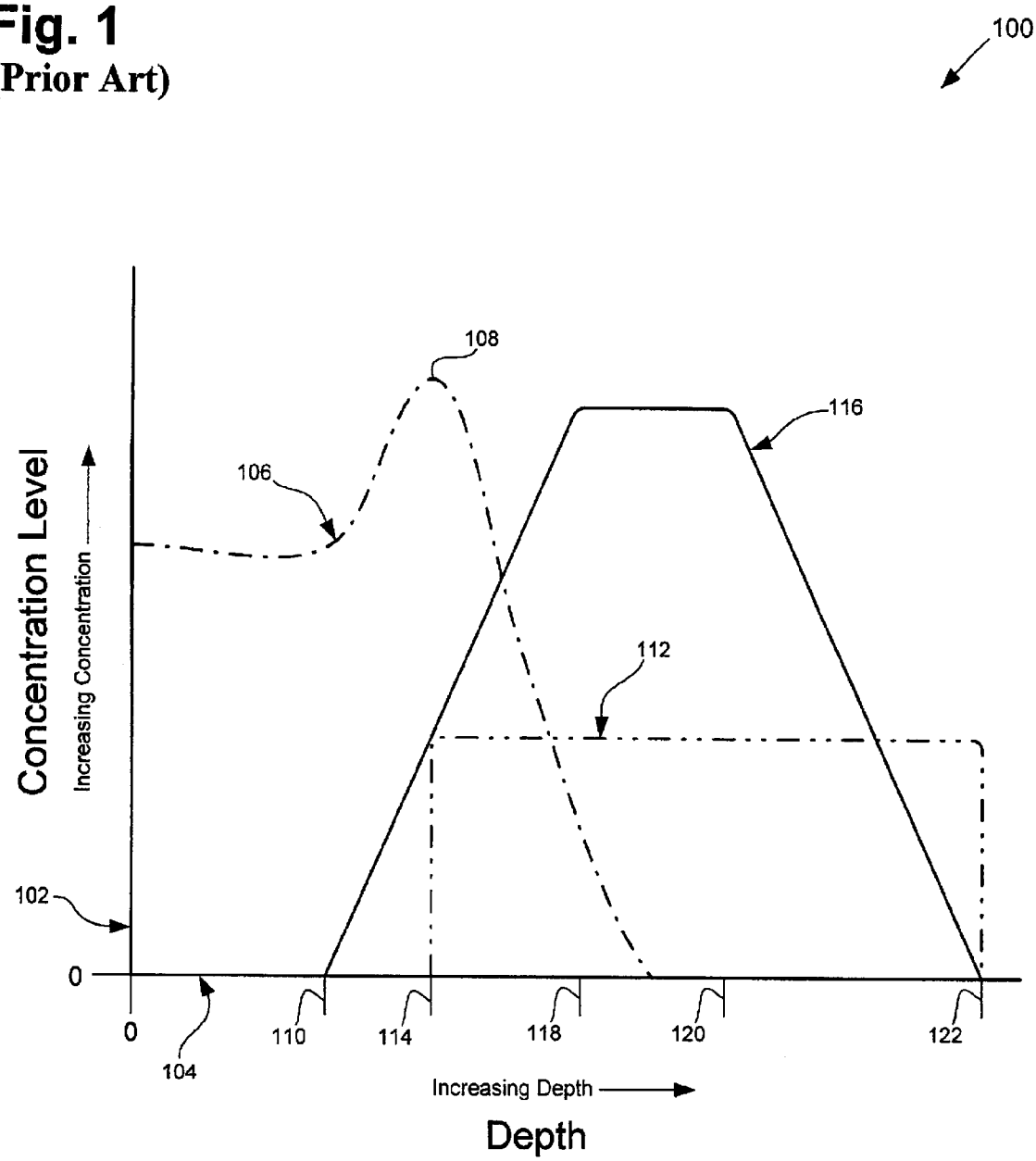
FIG. 1 is a graph showing boron, carbon, and germanium profiles in the base of a conventional exemplary NPN SiGe HBT.
Figure 2:
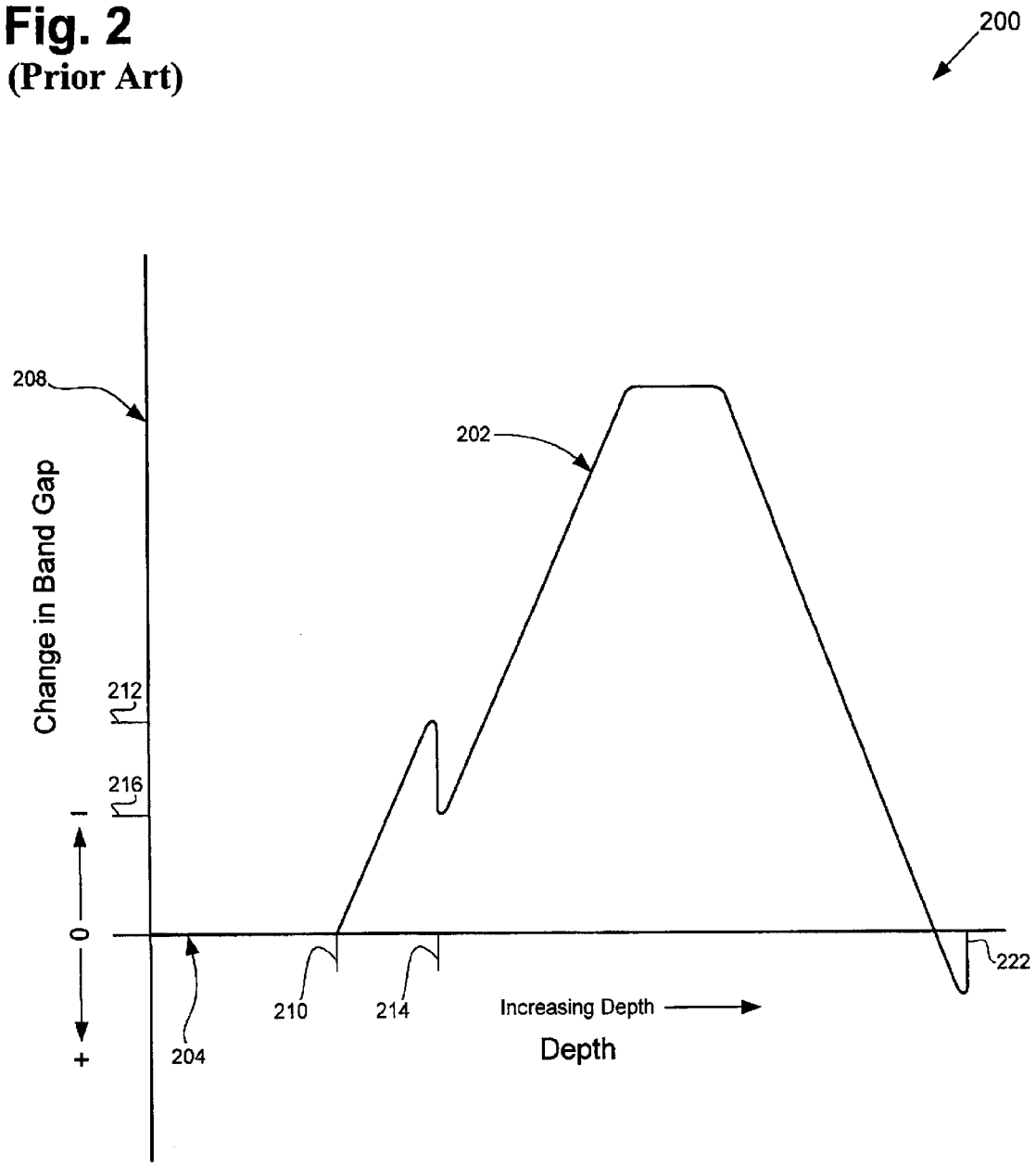
FIG. 2 is a graph showing a change in band gap of the base in a conventional exemplary NPN SiGe HBT of FIG. 1.

In contrast to the present invention, conventional germanium profile 116 in FIG. 1 shows no step increase in germanium at step 114 to offset the introduction of carbon at step 114 in a conventional base in the present exemplary NPN SiGe HBT. Thus, conventional band gap curve 202 in FIG. 2 shows an undesirable abrupt increase in band gap at depth 214, i.e. an increase from band gap level 212 to band gap level 216, resulting from the addition of carbon in the base of the exemplary NPN SiGe HBT.

Thus, by providing a step increase of germanium at depth 516 to compensate for the addition of carbon, the present invention provides a linear decrease in band gap from depth 514 to depth 518. Accordingly, the present invention provides the advantage of a constant electric field, i.e. an electric field without a discontinuity, in base 304 from depth 514 to depth 518. The above constant electric field in base 304 from depth 514 to depth 518 provided by the present invention results in a corresponding increase in performance of NPN SiGe HBT 308.

Although carbon and germanium are used as exemplary materials to illustrate an embodiment of the present invention, the present invention is generally directed to increasing a concentration of a second material to counteract a change in band gap caused by a first material. Thus, in the present embodiment, where the first material is carbon and the second material is germanium, the concentration of germanium is increased to counteract an increase in band gap caused by a concentration of carbon. In one embodiment, a first material may be different than carbon and/or a second material may be different than germanium. In that embodiment, the first material may affect the band gap differently than carbon. For example, the second material might be increased to counteract a decrease in band gap caused by a concentration of the first material.

From the above description of the invention it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. For example, the principles of the present invention are also applicable to NPN SiGe HBTs using a P-type dopant other than boron, or using a diffusion suppressant other than carbon. Moreover, the present invention is applicable to NPN HBTs using semiconductors other than silicon or germanium. Further, the present invention's principles can also be applied to PNP SiGe HBTs or to non-SiGe PNP HBTs. As such, the described embodiments are to be considered in all respects as illustrative and not restrictive. It should also be understood that the invention is not limited to the particular embodiments described herein, but is capable of many rearrangements, modifications, and substitutions without departing from the scope of the invention. For example, the specified layouts, dimensions, and doping levels are provided solely for the purpose of illustrating the present invention by way of a specific example and such dimensions, layouts, and doping levels can be manifestly varied without departing from the scope of the present invention.

Thus, a band gap compensated HBT has been described.

What is claimed is:

1. A heterojunction bipolar transistor comprising:
    a base having a concentration of a first material at a first depth, said concentration of said first material impeding diffusion of a base dopant, wherein said first material causes a change in band gap at said first depth in said base;
    said base having a concentration of a second material, said concentration of said second material having a step increase at said first depth so as to counteract said change in said band gap;
    wherein said band gap decreases at a linear rate between a second depth in said base and a third depth in said base, wherein said first depth is situated between said second depth and said third depth.

2. The heterojunction bipolar transistor of claim 1 wherein said first material is carbon.

3. The heterojunction bipolar transistor of claim 1 wherein said base dopant is boron.

4. The heterojunction bipolar transistor of claim 1 wherein said first material is carbon and wherein said base dopant is boron.

5. The heterojunction bipolar transistor of claim 1 wherein said first material causes an increase in said band gap at said first depth in said base.

6. The heterojunction bipolar transistor of claim 5 wherein said concentration of said second material increases at said first depth by an amount required to cause a decrease in said band gap to be substantially equal to said increase in said band gap caused by said concentration of said first material.

7. The heterojunction bipolar transistor of claim 5 wherein said concentration of said second material increases at said first depth by an amount required to cause a decrease in said band gap to be equal to said increase in said band gap caused by said concentration of said first material.

8. The heterojunction bipolar transistor of claim 5 wherein said first material is carbon and wherein said second material is germanium.

9. The heterojunction bipolar transistor of claim 1 wherein said heterojunction bipolar transistor is an NPN silicon-germanium heterojunction bipolar transistor.

10. The heterojunction bipolar transistor of claim 1 wherein said concentration of said second material is equal to 0.0 atomic percent at said second depth.

11. A method for fabricating a heterojunction bipolar transistor, said method comprising steps of:
    adding a concentration of a first material to a base at a first depth in said base, said concentration of said first material impeding diffusion of a base dopant, said first material causing a change in band gap of said base;
    step increasing a concentration of a second material at said first depth in said base so as to counteract said change in said band gap;
    decreasing said band gap between a second depth in said base and a third depth in said base, wherein said first depth is situated between said second depth and said third depth.

12. The method of claim 11 wherein said first material is carbon.

13. The method of claim 11 wherein said first material impedes diffusion of boron in said base.

14. The method of claim 11 wherein said first material is carbon and wherein said first material impedes diffusion of boron in said base.

15. The method of claim 11 wherein said first material causes an increase in said band gap at said first depth in said base.

16. The method of claim 15 wherein said concentration of said second material is increased at said first depth by an amount required to cause a decrease in said band gap to be substantially equal to said increase in said band gap caused by said concentration of said first material.

17. The method of claim 15 wherein said concentration of said second material is increased at said first depth by an amount required to cause a decrease in said band gap to be equal to said increase in said band gap caused by said concentration of said first material.

18. The method of claim 11 wherein said heterojunction bipolar transistor is an NPN silicon-germanium heterojunction bipolar transistor.

19. The method of claim 11 wherein said band gap is decreased between said second depth and said third depth by increasing said concentration of said second material between said second depth and said third depth, wherein said concentration of said second material is equal to 0.0 atomic percent at said second depth.

* * * * *